United States Patent
Alberto et al.

(10) Patent No.: US 10,359,466 B2
(45) Date of Patent: Jul. 23, 2019

(54) DEVICE FOR DETECTING AN ELECTRIC ARC BASED ON ITS ACOUSTIC SIGNATURE

(71) Applicant: Commissariat à l'Energie Atomique et aux Energies Alternatives, Paris (FR)

(72) Inventors: Diego Alberto, Fontaine (FR); Marco Ranieri, Gieres (FR); Raphaël Toufflet, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 99 days.

(21) Appl. No.: 15/617,645

(22) Filed: Jun. 8, 2017

(65) Prior Publication Data

US 2018/0074112 A1 Mar. 15, 2018

(30) Foreign Application Priority Data

Jun. 27, 2016 (FR) .................................. 16 55981

(51) Int. Cl.
*G01R 31/12* (2006.01)
*G01R 23/17* (2006.01)
*H02H 1/00* (2006.01)

(52) U.S. Cl.
CPC ......... *G01R 31/1209* (2013.01); *G01R 23/17* (2013.01); *H02H 1/0023* (2013.01)

(58) Field of Classification Search
CPC ... G01R 31/1209; G01R 23/17; H02H 1/0023
See application file for complete search history.

(56) References Cited

U.S. PATENT DOCUMENTS

| | | | |
|---|---|---|---|
| 4,677,363 A | 6/1987 | Kopmann | |
| 5,882,492 A * | 3/1999 | Manley | H01J 37/32018 118/624 |

(Continued)

FOREIGN PATENT DOCUMENTS

| | | |
|---|---|---|
| CN | 204441661 U | 7/2015 |
| FR | 2983968 | 6/2013 |

(Continued)

OTHER PUBLICATIONS

Preliminary Search Report in French Patent Application No. 1655981; dated Feb. 28, 2017, 2 pages.

(Continued)

*Primary Examiner* — Tung X Nguyen
*Assistant Examiner* — Dominic E Hawkins
(74) *Attorney, Agent, or Firm* — Moreno IP Law LLC

(57) ABSTRACT

The invention relates to a device for detecting an electric arc based on an analog output signal (104) of at least one acoustic wave sensor (102), this device including: an analog-to-digital converter (106) capable of sampling and digitizing the output signal (104) of the sensor (102); a digital processing circuit (110) capable of implementing a frequency domain analysis of the digital output signal (108) of the converter (106) enabling to detect the possible presence of an arc based on its acoustic signature; and an analog circuit (118) for detecting the exceeding of a power threshold by the output signal (104) of the sensor (102), wherein the digital processing circuit (110) is configured to implement the frequency domain analysis only on detection of the exceeding of a threshold by the analog circuit (118).

14 Claims, 3 Drawing Sheets

(56) References Cited

U.S. PATENT DOCUMENTS

| | | | |
|---|---|---|---|
| 6,215,408 B1* | 4/2001 | Leonard | G01R 31/3274 324/415 |
| 6,927,579 B2 | 8/2005 | Blades | |
| 7,148,696 B2 | 12/2006 | Zhou et al. | |
| 7,463,037 B2* | 12/2008 | Henson | H02H 1/0015 324/536 |
| 8,040,517 B1* | 10/2011 | Wu | H02H 1/0023 356/432 |
| 8,474,320 B2 | 7/2013 | Kordon et al. | |
| 2006/0164097 A1 | 7/2006 | Zhou et al. | |
| 2006/0254355 A1* | 11/2006 | Zhou | G01R 31/026 73/579 |
| 2007/0183103 A1* | 8/2007 | Sung | H02H 1/0015 361/42 |
| 2007/0208520 A1* | 9/2007 | Zhang | H02H 1/0015 702/58 |
| 2011/0125419 A1 | 5/2011 | Bechhoefer et al. | |
| 2011/0267721 A1* | 11/2011 | Chaintreuil | G01R 31/1209 361/2 |
| 2012/0095706 A1* | 4/2012 | Zhou | G01R 31/1209 702/58 |
| 2014/0112041 A1* | 4/2014 | Collin | H02J 3/383 363/123 |
| 2014/0301008 A1 | 10/2014 | Gouy-Pailler et al. | |
| 2015/0061696 A1 | 3/2015 | Dahmani et al. | |
| 2016/0003886 A1* | 1/2016 | Djeddi | G01R 31/088 702/58 |
| 2016/0187409 A1* | 6/2016 | Kolker | G01R 31/025 361/42 |
| 2016/0320442 A1 | 11/2016 | Perichon | |
| 2016/0341782 A1* | 11/2016 | Huang | H02H 1/0023 |
| 2017/0331273 A1* | 11/2017 | Lee | H02H 3/162 |

FOREIGN PATENT DOCUMENTS

| | | | |
|---|---|---|---|
| FR | 3015045 A1 | 6/2015 | |
| WO | WO-2007106253 A1 * | 9/2007 | H02H 1/0015 |
| WO | 2013150157 A1 | 10/2013 | |

OTHER PUBLICATIONS

Preliminary Search Report in French Patent Application No. 1563381; dated Oct. 27, 2016, 1 page.

Swedan, A. et al.; Enhancement of acoustic based partial discharge detection using pattern recognition techniques; Electric Power and Energy Conversion Systems (EPECS), 2011 2nd International Conference on; IEEE; Nov. 15, 2011.

Kundu, P. et al.; Frequency domain analysis of acoustic emission signals for classification of partial discharges; Electric Insulation and Dielectric Phenomena, 2007. CEIDP 2007. Annual Report—Conference on; IEEE; Oct. 14, 2007.

Boczar, Tomasz et al.; The Application of Modern Signal Processing Methods in the Acoustic Emission Method for the Measurement of Insulation Systems of Power Transformers; European Conference on Non Destructive Testing; Sep. 25, 2006.

* cited by examiner

DEVICE FOR DETECTING AN ELECTRIC ARC BASED ON ITS ACOUSTIC SIGNATURE

BACKGROUND

The present disclosure relates to a device for detecting the forming of an electric arc in an electric system based on its acoustic signature.

DISCUSSION OF THE RELATED ART

In many electric systems, especially high-voltage systems such as electrical cabinets, transformers, electric batteries, electric distribution networks, etc., electric arcs may form, for example due to an overvoltage or to a failure such as the breakage of a cable or the wearing of an insulator. If it is continuous, an electric arc may cause serious damage and particularly cause the starting of a fire. Electric arcs are particularly dangerous in DC power supply electric systems, since one cannot rely on a "natural" zero crossing of the power supply voltage to extinguish the arc. The anticipated detection of the forming of an electric arc is a major issue for the security of many electric systems.

Various solutions have been provided to detect the forming of an electric arc in an electrical system. Detection methods based on current and voltage measurements in the system, detection methods based on optical signal measurements, detection methods based on electromagnetic signal measurements, and detection methods based on acoustic signal measurements have in particular been provided.

Detection methods based on acoustic signal measurements are here more particularly considered.

SUMMARY

Thus, an embodiment provides a device for detecting an electric arc based on an analog output signal of at least one acoustic wave sensor, this device comprising: an analog-to-digital converter capable of sampling and digitizing the output signal of the sensor; a digital processing circuit capable of implementing a frequency domain analysis of the digital output signal of the converter enabling to detect the possible presence of an arc based on its acoustic signature; and an analog circuit for detecting the exceeding of a power threshold by the output signal of the sensor, wherein the digital processing circuit is configured to implement the frequency domain analysis only on detection of the exceeding of a threshold by the analog circuit.

According to an embodiment, the analog detection circuit comprises an analog circuit for comparing a quantity representative of the amplitude of the analog output signal of the sensor with a predetermined threshold.

According to an embodiment, the analog detection circuit further comprises an analog circuit for rectifying the analog output signal of the sensor, upstream of the comparison circuit.

According to an embodiment, the rectifying circuit comprises a diode bridge.

According to an embodiment, the rectifying circuit is an active circuit comprising at least one operational amplifier and at least two controlled switches.

According to an embodiment, the analog detection circuit further comprises an analog envelope detection circuit upstream of the comparison circuit.

According to an embodiment, the analog-to-digital converter is capable of permanently digitizing, that is, even when the frequency domain analysis has not been triggered by the analog detection circuit, the output signal of the sensor.

According to an embodiment, the digital processing device is capable of permanently storing, that is, even when the frequency domain analysis has not been triggered by the analog detection circuit, a plurality of samples of the output signal of the analog-to-digital converter.

According to an embodiment, the frequency domain analysis comprises calculating the spectral power density of the output signal of the converter.

According to an embodiment, the frequency domain analysis further comprises calculating a quantity representative of the energy of the output signal of the converter in a spectral band characteristic of electric arcs, and detecting the possible crossing of an energy threshold in this band.

According to an embodiment, the quantity representative of the energy of the output signal of the converter in a spectral band characteristic of electric arcs is normalized with respect to a quantity representative of the energy of the output signal of the converter in another spectral band.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF THE PRESENT EMBODIMENTS

Figure 1:
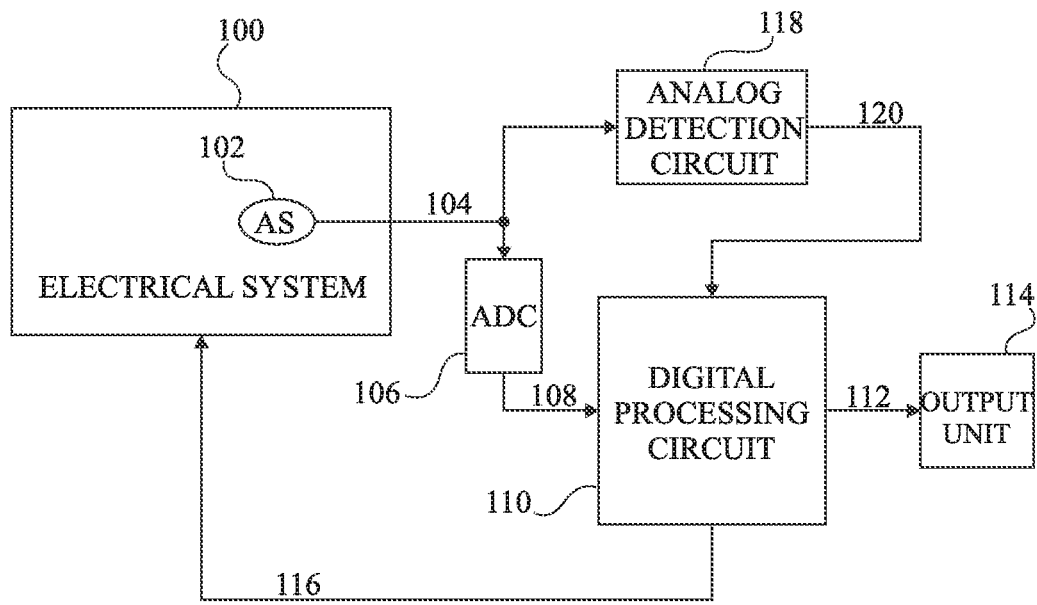
FIG. 1 illustrates an electrical system provided with an electric arc detection device according to an embodiment.

The same elements have been designated with the same reference numerals in the different drawings. For clarity, only those elements which are useful to the understanding of the described embodiments have been shown and are detailed. In particular, the electrical systems where electric arcs are desired to be detected have not been detailed, the described detection solutions being compatible with any electrical system where electric arcs are likely to occur. Unless otherwise specified, expressions "approximately", "substantially", and "in the order of" mean to within 10%, preferably to within 5%. In the present description, term "connected" is used to designate a direct electric connection, with no intermediate electronic component, for example, by means of one or a plurality of conductive tracks or conductive wires, and term "coupled" or term "linked" is used to designate an electric connection which may be direct (then meaning "connected") or indirect (that is, via one or a plurality of intermediate components).

FIG. 1 shows an electrical system 100 to be monitored, for example, an electrical cabinet, an electric power distribution network in an airplane, an electric battery, or any other electrical system where the possible occurrence of an electric arc is desired to be detected.

Electrical system 100 is equipped with an electric arc detection device comprising an acoustic sensor 102, for example, an ultrasound sensor, capable of detecting acoustic waves in system 100. The forming of an arc indeed goes along with the emission of characteristic acoustic waves, the detection of which may enable to identify the presence of the arc. Sensor 102 may be arranged in physical contact with an electric conductor which is desired to be particularly monitored, to sense the acoustic waves propagating in this conductor. As a variation, sensor 102 may be arranged to sense the acoustic waves propagating in air inside of or close to the installation. Sensor 102 is for example a vibrating membrane microphone, for example, a MEMS-type ("Micro Electro Mechanical System") microphone. Sensor 102 is capable of supplying an output electric signal 104, for example, a voltage, representative of the amplitude of the acoustic waves detected by the sensor. Output signal 104 of sensor 102 is a continuous-time, that is, non-sampled, analog signal. In practice, output signal 104 of sensor 102 may be pre-processed by analog amplification and/or filtering circuits (not detailed) of sensor 102. Although a single sensor 102 has been illustrated in FIG. 1, in alternative embodiments, a plurality of sensors 102 may be provided to monitor different portions of system 100. The outputs of the different sensors 102 may then be separately processed similarly or identically to what will be discussed in further detail hereafter.

The arc detection device further comprises an analog-to-digital conversion circuit 106 having its input connected to the output of sensor 102. Circuit 106 is capable of supplying a sampled digital signal 108 representative of analog output signal 104 of sensor 102. Output signal 108 of analog-to-digital converter 106 is a time-domain signal, showing the time variation of the amplitude of the acoustic waves detected by sensor 102.

The arc detection device further comprises a digital processing circuit 110, for example comprising a microprocessor, having an input connected to the output of analog-to-digital converter 106. Calculation device 110 is capable of analyzing output signal 108 of analog-to-digital converter 106 to detect the possible presence of an electric arc in system 100. Processing circuit 110 for example supplies an output signal 112 to an output unit 114 of the electric arc detection device, which may be an alarm, a display, or any other interface element enabling to inform a user of the presence of an arc in system 100. Processing circuit 110 may supply, in addition to or instead of output signal 112, an output signal 116 sent back to system 100, which may for example order emergency shutdown measures for system 100 when an electric arc is detected, for example, by interrupting the power supply current in all or part of system 100.

The implementation of a robust electric arc detection based on the acoustic signature thereof involves a frequency domain analysis of the acoustic signals detected by sensor 102. Indeed, the detection of acoustic energy peaks in specific frequency bands, for example, between 80 and 120 kHz in the case of waves propagating in electric conductors of the installation, or between 65 and 90 kHz in the case of waves propagating in air, provides good electric arc detection performances and enables to minimize risks of false detection due to other phenomena capable of generating acoustic signals, for example, mechanical shocks. The relation between the considered frequency band and the associated phenomenon depends on a plurality of parameters, among which the transfer function of the sensor, the physical characteristics of the transmission means, temperature, the atmospheric pressure, etc. The real-time frequency domain analysis of output signal 108 of digital-to-analog converter 106 however requires significant calculation resources, and results in a high electric power consumption of processing circuit 110.

According to an aspect of an embodiment, the electric arc detection device comprises an analog circuit 118 connected to the output of sensor 102 and capable of detecting the exceeding of a predetermined power threshold by analog output signal 104 of sensor 102. Circuit 118 supplies an output signal 120, for example, a binary signal, having its state changing when a quantity representative of the power or amplitude level of output signal 104 of sensor 102 exceeds a predetermined threshold. The output of analog circuit 118 is connected to processing circuit 110. Circuit 110 is configured to implement a frequency domain analysis of output signal 108 of analog-to-digital converter 106 to detect the possible presence of an arc, only when circuit 118 detects that a power or amplitude threshold has been exceeded by output signal 104 of sensor 102. In other words, analog circuit 118 implements a continuous monitoring of system 100, enabling to detect as quickly as possible the forming of an electric arc, but only triggers the frequency domain analysis when an acoustic event of significant power is detected, to enable to discriminate an electric arc among different types of events capable of causing acoustic waves of significant power.

An advantage of the embodiment of FIG. 1 is that, in the absence of a remarkable acoustic event detected by analog circuit 118, digital processing circuit 110 does not perform the frequency domain analysis, which requires heavy calculation resources, of digital signal 108. This enables to limit the general electric power consumption of the arc detection device.

Another advantage is that the detection of a remarkable acoustic event used to decide whether to trigger or not the frequency domain analysis is carried out in the analog domain, before the sampling of the output signal of sensor 102. This enables to guarantee a fast detection of any event generating acoustic waves of significant power, and thus to detect the forming of an arc as soon as possible.

Preferably, analog-to-digital converter 106 permanently digitizes, that is, even in the absence of a remarkable acoustic event, analog output signal 104 of sensor 102, and processing circuit 110 permanently stores, for example, in a FIFO-type memory, a determined number p, for example in the range from 200 to 2,000, of samples of digital output signal 108 of converter 106. This enables device 110, when the frequency domain analysis is triggered by circuit 118, to be able to have samples of the acoustic signal preceding the beginning of the arc forming. This improves the detection performance since the frequency components most characteristic of an arc are often present at the beginning of the arc. The described embodiments are however not limited to this specific case.

Figure 2:
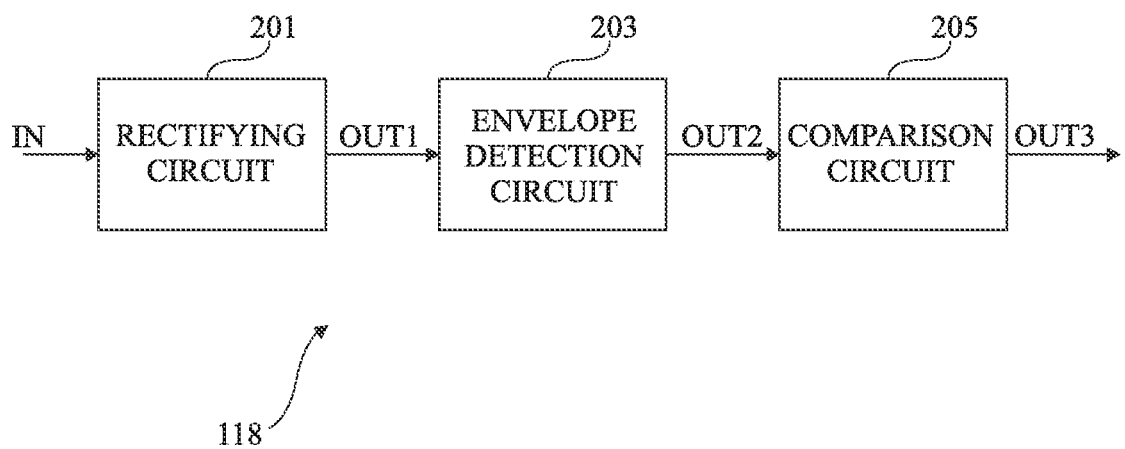
FIG. 2 schematically illustrates in the form of blocks an example of an analog circuit for detecting an acoustic power threshold of the device of FIG. 1.

FIG. 2 schematically illustrates, in the form of blocks, an embodiment of analog circuit 118 of arc detection device of FIG. 1.

In the example of FIG. 2, circuit 118 comprises a rectifying circuit 201, receiving as an input an analog signal IN, corresponding to output signal 104 of sensor 102 of FIG. 1, and outputting a rectified analog signal OUT1.

Circuit 118 of FIG. 2 further comprises an envelope detection circuit 203 receiving as an input output signal OUT1 of rectifying circuit 201, and outputting an analog signal OUT2 representative of the envelope of signal OUT1.

Circuit 118 of FIG. 2 further comprises a circuit 205 for comparing signal OUT2 with a threshold. Circuit 205 supplies an output signal OUT3, for example, a binary signal, representative of the result of the comparison. Output signal OUT3 of comparator 205 corresponds to output signal 120 of circuit 118, and is used to trigger the implementation of the frequency domain analysis of the acoustic signal by digital processing circuit 110 of FIG. 1. Comparator 205 is preferably a hysteresis comparator to avoid unwanted oscillations of signal OUT3.

It should be noted that circuits 201 and/or 203 of the example of FIG. 2 are optional. As a variation, circuits 201 and 203 may be omitted, and comparator 205 may directly receive input signal IN as an input. In another variation, circuit 203 may be omitted, and comparator 205 may directly receive output signal OUT1 of rectifying circuit 201 as an input. In another variation, circuit 201 may be omitted, circuit 203 then supplying comparator 205 with a signal OUT2 representative of the envelope of signal IN.

Figure 3:
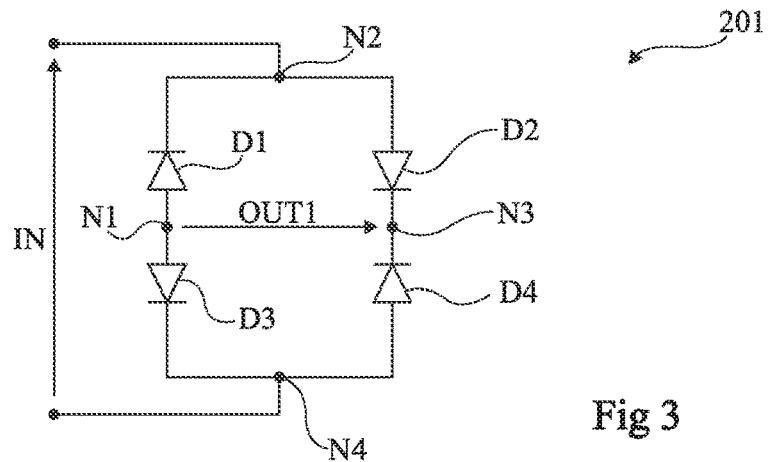
FIG. 3 is an electric diagram of an embodiment of a voltage rectifier circuit of the analog circuit of FIG. 2.

FIG. 3 is an electric diagram of an embodiment of rectifying circuit 201 of FIG. 2. In this example, signals IN and OUT1 are considered to be voltages. Rectifying circuit 201 of FIG. 3 is a fullwave rectifying circuit comprising four diodes D1, D2, D3, D4. Diode D1 is forward-connected between nodes N1 and N2 of circuit 201, that is, the anode and the cathode of diode D1 are respectively connected to node N1 and to node N2. Diode D2 is forward-connected between node N2 and a node N3 of circuit 201. Diode D3 is forward-connected between node N1 and a node N4 of circuit 201. Diode D4 is forward-connected between node N4 and node N3. Input voltage IN of rectifying circuit 201 is applied between nodes N2 and N4, and rectified output voltage OUT1 is supplied between nodes N3 and N1.

Figure 4:
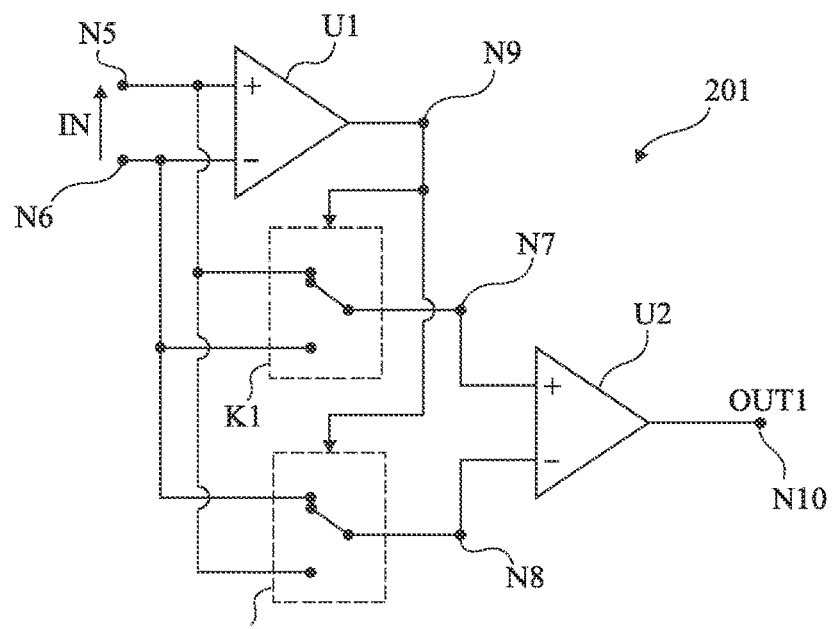
FIG. 4 is an electric diagram of another embodiment of a voltage rectifier circuit of the analog circuit of FIG. 2.

FIG. 4 is an electric diagram of another embodiment of rectifying circuit 201 of FIG. 2. As compared with the circuit of FIG. 3, the circuit of FIG. 4 has the advantage of avoiding the voltage drop introduced by diodes D1, D2, D3, D4 of the circuit of FIG. 3 between input signal IN and output signal OUT1 of the circuit. Circuit 201 of FIG. 4 comprises a first operational amplifier U1 assembled as a comparator, having its positive input (+) connected to a first node N5 of application of input voltage IN and having its negative input (−) connected to a second node N6 of application of input voltage IN (that is, voltage IN is applied between nodes N5 and N6). Circuit 201 of FIG. 4 further comprises a second operational amplifier U2 assembled as a differential amplifier having a gain greater than or equal to 1, having its positive input (+) connected to a node N7 of the circuit and having its negative input (−) connected to a node N8 of the circuit. Circuit 201 of FIG. 4 further comprises two switches K1 and K2. Switch K1 is capable of connecting node N7 either to node N5 or to node N6, and switch K2 is capable of connecting node N8 either to node N6 or to node N5. Switches K1 and K2 have their control nodes connected to an output node N9 of operational amplifier U1. Switches K1 and K2 preferably have a low or even negligible on-state resistance, for example, in the range from 10 to 50 mΩ. Output voltage OUT1 of circuit 201 (referenced to the circuit ground, not shown) is supplied to an output node N10 of operational amplifier U2. Circuit 201 of FIG. 4 operates as follows. When the potential of node N5 is greater than that of node N6 (positive halfwave of input voltage IN), the output of comparator U1 is in a first state, whereby switch K1 connects node N7 to node N5 and switch K2 connects node N8 to node N6. The positive halfwave of signal IN is then amplified by amplifier U2 and copied on output N10 of circuit 201. When the potential of node N5 is smaller than that of node N6 (negative halfwave of input voltage IN), the output of comparator U1 is in a second state, whereby switch K1 connects node N7 to node N6 and switch K2 connects node N8 to node N5. The negative halfwave of signal IN is thus rectified via switches K1 and K2, and copied on output N10 of circuit 201 after amplification by amplifier U2.

Figure 5:
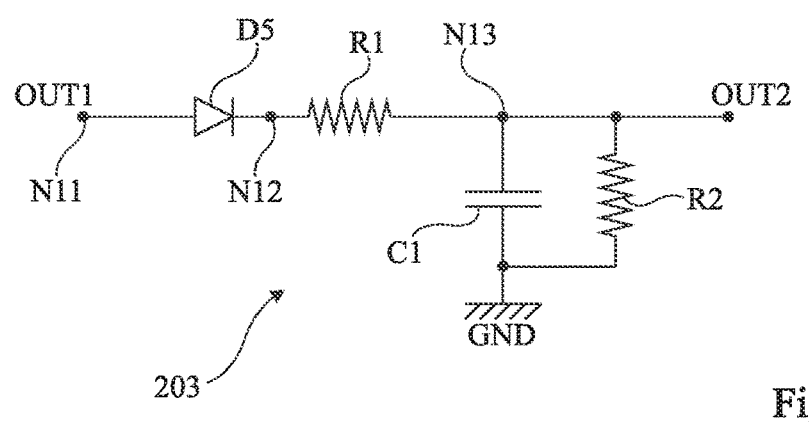
FIG. 5 is an electric diagram of an embodiment of an envelope detection circuit of the analog circuit of FIG. 2.

FIG. 5 is an electric diagram of an embodiment of envelope detection circuit 203 of FIG. 2. In this example, circuit 203 comprises a diode D5 connected between nodes N11 and N12 of the circuit. Node N11 forms an input node of circuit 203, having input voltage OUT1, referenced to a node GND of application of a reference potential or circuit ground, applied onto it. Circuit 203 of FIG. 5 further comprises a resistor R1 connecting node N12 to a node N13 of the circuit, and a capacitor C1 connecting node N13 to node GND. In this example, circuit 203 further comprises a resistor R2 connected in parallel with capacitor C1, between nodes N13 and GND. Node N13 forms an output node of the circuit, having output voltage OUT2 of the circuit supplied onto it. Resistor R1 sets the charge speed of capacitor C1 under the effects of the oscillations of the input signal. Resistor R2 is a discharge resistor for capacitor C1, having a value significantly larger than the value of resistor R1, for example, a value at least ten times larger than the value of resistor R1.

Figure 6:
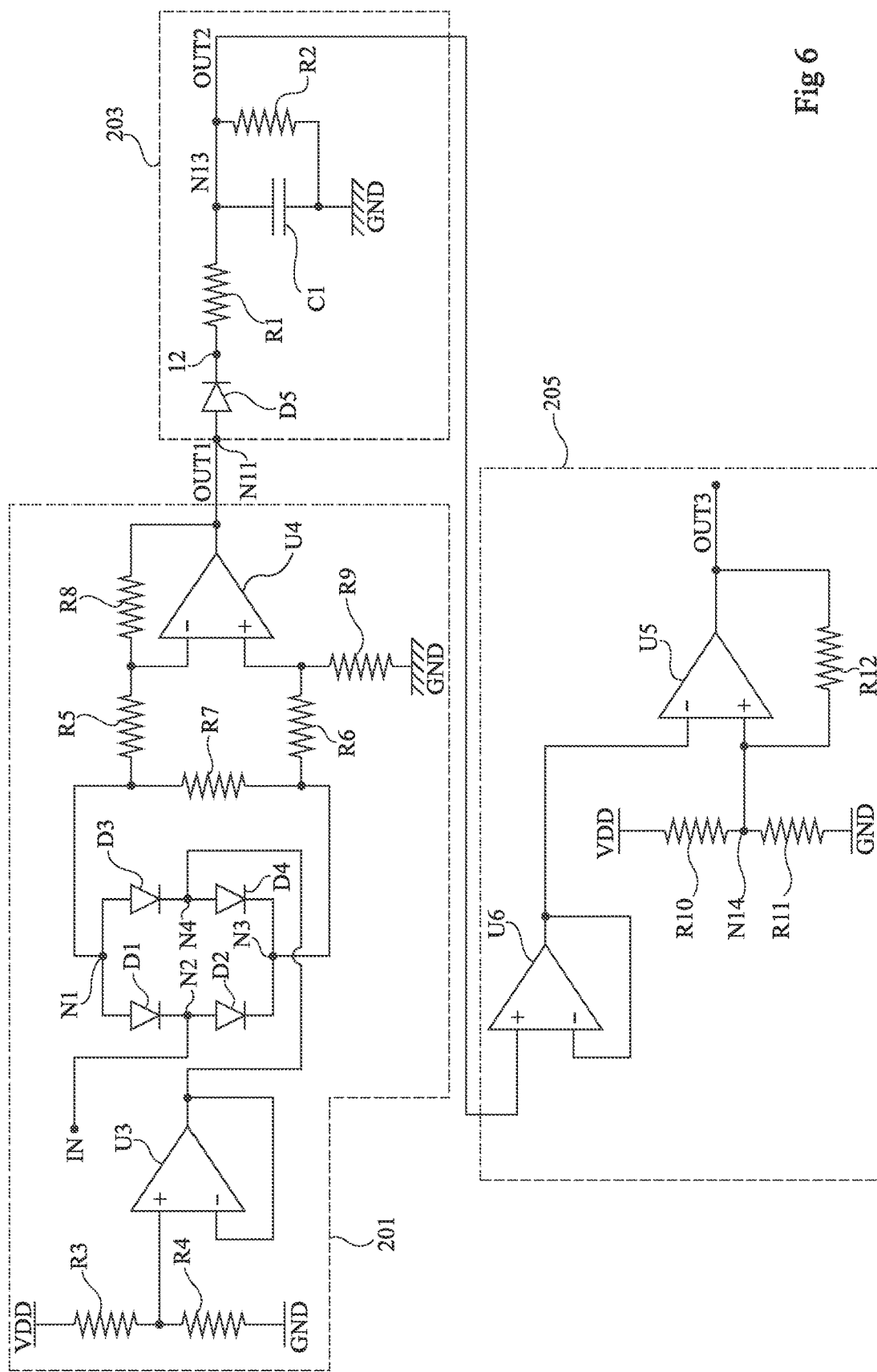
FIG. 6 is an electric diagram of an embodiment of the analog circuit of FIG. 2, which is based both on a rectifier circuit of the type described in relation with FIG. 3 and on an envelope detection circuit of the type described in relation with FIG. 5.

FIG. 6 is an electric diagram of an embodiment of the analog circuit assembly of FIG. 2.

In this example, rectifying circuit 201 comprises a diode bridge identical or similar to that of FIG. 3. As in the example of FIG. 3, input voltage IN is applied to node N2 of the diode bridge. In the example of FIG. 6, a fixed reference potential is applied to node N4 of the diode bridge. To achieve this, rectifying circuit 201 of FIG. 6 comprises a biasing circuit comprising an operational amplifier U3 assembled as a voltage follower, and a resistive voltage dividing bridge comprising resistors R3 and R4 series-connected between a node VDD of application of a high power supply potential of the circuit, for example, a potential in the range from 2 to 10 V, for example, in the order of 5 V, and a node GND of application of a low reference potential of the circuit, for example, the ground. The positive input (+) of operational amplifier U3 is connected to the junction point of resistors R3 and R4, and the negative input (−) of operational amplifier U3 is connected to its output. The output of operational amplifier U3 is connected to node N4. Further, in the example of FIG. 6, rectifying circuit 201 comprises a circuit of differential amplification of the output voltage of the diode bridge, having a gain greater than or equal to 1. The differential amplification circuit comprises an operational amplifier U4 having its negative input (−) connected to node N1 by a resistor R5, and having its positive input (+) connected to node N3 by a resistor R6, for example, having the same value as resistor R5. The differential amplification circuit further comprises a resistor R7 connecting node N1 to node N3. The differential amplification circuit further comprises a resistor R8 connecting the negative input (−) of operational amplifier U4 to its output, and a resistor R9 connecting the positive input (+) of operational amplifier U4 to reference node GND of the circuit. Output voltage OUT1 of circuit 201 (referenced to the circuit ground) is supplied to the output node of operational amplifier U4.

In the example of FIG. 6, envelope detection circuit 203 is identical or similar to that of FIG. 5, input node N11 of circuit 203 being connected to the output node of operational amplifier U4 of circuit 201.

In this example, comparison circuit 205 comprises an operational amplifier U5 assembled as a hysteresis comparator, for example, in a Schmitt trigger assembly. The negative input (−) of operational amplifier U5 is connected to output node N13 of envelope detection circuit 203 via a voltage follower or a unity gain amplifier. The voltage follower comprises an operational amplifier U6 having its positive input (+) connected to node N13 and having its negative input (−) connected to its output. The output of operational amplifier U6 is connected to the negative input (−) of operational amplifier U5. The positive input (+) of operational amplifier U5 is connected to a node N14 of application of a fixed potential setting the high triggering threshold of the comparator. In this example, the threshold voltage of the comparator is supplied by a resistive dividing bridge comprising a resistor R10 connecting node N14 to power supply node VDD of the circuit, and a resistor R11 connecting node N14 to reference node or circuit ground GND. Comparator 205 further comprises a resistor R12 connecting the positive input (+) of operational amplifier U5 to its output. Output voltage OUT3 of circuit 205 (referenced to ground) is supplied to the output node of operational amplifier U5.

Frequency Domain Analysis

An example of a frequency domain analysis method capable of being implemented by digital processing circuit 110 of FIG. 1 when a remarkable acoustic event is signaled by analog circuit 118 will now be described.

The frequency domain analysis comprises converting the time domain signal 108 supplied by analog-to-digital converter 106 to the frequency domain. To achieve this, the frequency domain analysis for example comprises calculating a short-time Fourier transform or STFT over a window W[i] of n consecutive samples of signal 108, where n is an integer greater than 1, for example, in the range from 200 to 2,000. The spectral power density or DSP in processing window W[i] can then be estimated, for example, by calculating the square module of the STFT normalized on the total energy of the processed window. Knowing the frequency bands of the acoustic waves generated by an electric arc, it is then possible to efficiently detect/discriminate an electric arc from among different types of events. As an example, the frequency domain analysis may comprise calculating the energy of signal 108 in a spectral band characteristic of electric arcs, for example, the band from 80 to 120 kHz or in the band from 65 to 90 kHz, and detecting the possible crossing of an energy threshold in this band. In a preferred embodiment, the spectral processing of signal 108 may be carried on by sliding processing window W[i] to construct the spectrogram of signal 108, that is, an array where each column contains the DSP of signal 108 for a time window of samples of signal 108. The spectrogram calculation enables to follow the time variation of the spectrum of signal 108. The performed analysis then is a time and frequency domain analysis, which has the advantage of further improving the electric arc detection/discrimination performances. The frequency domain analysis may in particular comprise analyzing the time variation of the energy of signal 108 in one or a plurality of specific spectral bands. Such an analysis may be carried out differentially, for example, by comparing the energy of signal 108 in a spectral band characteristic of electric arcs with the energy of signal 108 in one or a plurality of other spectral bands, for example, a high frequency spectral band, for example, in the range from 150 to 250 kHz.

The STFT calculated during the frequency domain analysis can be defined as follows:

$$STFT\{x[k]\}(m, \omega) = X[m, \omega] = \sum_{k=-\infty}^{+\infty} x[k] - \text{wind}[k-m] \cdot e^{-j\omega k}$$

where $X[m,\omega]$ is the STFT, m and $\omega$ are the variables discretized for time (m) and frequency ($\omega$) of the STFT, $x[k]$ is the signal over time, k is the discrete time, and wind[ ] is the sliding window used to select and weight the subset of samples having the STFT estimated thereon.

For a determined time m, the DSP calculated during the frequency domain analysis can be defined as follows:

$$P_{X,norm}(\omega) = \frac{|X[w]|^2}{\sum_{\omega=0}^{\omega s/2} |X[\omega]|^2}$$

where $X[\omega]$ is the STFT for a determined time m, and where the sum at the denominator corresponds to the total energy of the signal contained in the band from 0 to $\omega s/2$, with $\omega s = 2\pi fs$, fs being the sampling frequency of signal 108.

DSP $P_{X,norm}(\omega)$ may be calculated at each time m, to generate the time-frequency spectrogram.

Specific embodiments have been described. Various alterations, modifications, and improvements will occur to those skilled in the art. In particular, the described embodiments are not limited to the above-described example of a method of frequency domain analysis of signal 108. More generally, any other frequency domain analysis method enabling to detect an electric arc based on its acoustic signature may be implemented by digital processing circuit 110 after the detection of a remarkable event by analog circuit 118.

Further, the described electric arc detection method may comprise optional additional steps to improve its performances. As an example, an analog preprocessing of signal 104 and/or a digital preprocessing of signal 108 may be implemented, to perform a band-pass filtering of the acoustic signal, according to a bandwidth including the typical emission frequencies of electric arcs and of mechanical shocks, to decrease the energy contribution of noise. It should be noted that the including of the characteristic frequencies of mechanical shocks in the bandwidth of the preprocessing filter (in addition to the characteristic frequencies of electric arcs) is optional, but has the advantage of enabling to implement an arc detection by differential analysis (difference between the energy at the characteristic frequencies of arcs and the energy at the characteristic frequencies of shocks).

Further, the described embodiments are not limited to the specific embodiments of analog circuit 118 described in relation with FIGS. 3, 4, 5, and 6.

What is claimed is:

1. A device for detecting an electric arc based on an analog output signal of at least one acoustic wave sensor, this device comprising:
an analog-to-digital converter configured to sample and digitize the output signal of the at least one sensor;

a digital processing circuit configured to implement a frequency domain analysis of the digital output signal of the analog-to-digital converter enabling to detect the possible presence of an arc based on its acoustic signature; and an analog detection circuit for detecting the exceeding of a power threshold by the output signal of the at least one sensor, wherein the digital processing circuit is configured to implement the frequency domain analysis only on detection of the exceeding of a threshold by the analog circuit.

2. The device of claim 1, wherein the analog detection circuit comprises an analog circuit for comparing a quantity representative of the amplitude of the analog output signal of the sensor with a predetermined threshold.

3. The device of claim 2, wherein the analog detection circuit further comprises an analog circuit for rectifying the analog output signal of the sensor, upstream of the comparison circuit.

4. The device of claim 3, wherein the rectifying circuit comprises a diode bridge.

5. The device of claim 3, wherein the rectifying circuit is an active circuit comprising at least one operational amplifier and at least two controlled switches.

6. The device of claim 2, wherein the analog detection circuit further comprises an analog envelope detection circuit upstream of the comparison circuit.

7. The device of claim 1, wherein the analog-to-digital converter is configured to permanently digitize, that is, even when the frequency domain analysis has not been triggered by the analog detection circuit, the output signal of the sensor.

8. The device of claim 7, wherein the digital processing device is configured to permanently store, that is, even when the frequency domain analysis has not been triggered by the analog detection circuit, a plurality of samples of the output signal of the analog-to-digital converter.

9. The method of claim 1, wherein the frequency domain analysis comprises calculating a spectral power density of the output signal of the converter.

10. The device of claim 9, wherein the frequency domain analysis further comprises calculating a quantity representative of the energy of the output signal of the converter in a spectral band characteristic of electric arcs, and detecting the possible crossing of an energy threshold in this band.

11. The device of claim 10, wherein said quantity representative of the energy of the output signal of the converter in a first spectral band characteristic of electric arcs is normalized with respect to a quantity representative of the energy of the output signal of the converter in a second spectral band.

12. The device of claim 11, wherein the second spectral band is wider than the first spectral band and comprises the first spectral band.

13. The device of claim 11, wherein the first and second spectral bands are separate.

14. The device of claim 9, wherein the time domain analysis comprises an analysis of the time variation of said spectral power density of the output signal of the converter.

* * * * *